(12) United States Patent
Moon et al.

(10) Patent No.: US 9,129,672 B2
(45) Date of Patent: Sep. 8, 2015

(54) SEMICONDUCTOR DEVICE AND OPERATING METHOD THEREOF

(71) Applicant: SK hynix Inc., Icheon-si Gyeonggi-do (KR)

(72) Inventors: Young-Suk Moon, Icheon-si (KR); Yong-Kee Kwon, Seoul (KR); Hong-Sik Kim, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 262 days.

(21) Appl. No.: 13/964,489

(22) Filed: Aug. 12, 2013

(65) Prior Publication Data
US 2014/0095786 A1    Apr. 3, 2014

(30) Foreign Application Priority Data

Sep. 28, 2012    (KR) .......................... 10-2012-0109437

(51) Int. Cl.
| | |
|---|---|
| G06F 12/00 | (2006.01) |
| G11C 19/00 | (2006.01) |
| G06F 3/06 | (2006.01) |
| G11C 11/4078 | (2006.01) |
| G11C 11/408 | (2006.01) |
| G11C 8/08 | (2006.01) |

(52) U.S. Cl.
CPC .............. *G11C 19/00* (2013.01); *G06F 3/0614* (2013.01); *G06F 3/0619* (2013.01); *G11C 8/08* (2013.01); *G11C 11/408* (2013.01); *G11C 11/4078* (2013.01)

(58) Field of Classification Search
CPC ...... G11C 8/08; G11C 19/00; G11C 11/4078; G11C 11/408; G06F 3/0614; G06F 3/0619
See application file for complete search history.

(56) References Cited

U.S. PATENT DOCUMENTS

| | | | | |
|---|---|---|---|---|
| 2007/0014174 | A1* | 1/2007 | Ohsawa | 365/222 |
| 2008/0165914 | A1 | 7/2008 | Horgan | |
| 2009/0245120 | A1* | 10/2009 | Jones | 370/252 |
| 2010/0074042 | A1* | 3/2010 | Fukuda et al. | 365/222 |
| 2015/0043294 | A1* | 2/2015 | Yang | 365/222 |

* cited by examiner

*Primary Examiner* — John Lane
(74) *Attorney, Agent, or Firm* — William Park & Associates Ltd.

(57) ABSTRACT

A semiconductor device includes a first stage register for storing events occurring for a first period, a second stage register for storing events occurring for a second period shorter than the first period and a controller for controlling the second stage register to select events from the second stage register each having a reference value larger than a second threshold value to the first stage register and for controlling the first stage register to store events which are selected from the second stage register.

18 Claims, 10 Drawing Sheets

SEMICONDUCTOR DEVICE AND OPERATING METHOD THEREOF

CROSS-REFERENCE TO RELATED APPLICATIONS

The present application claims priority of Korean Patent Application No. 10-2012-0109437, filed on Sep. 28, 2012, which is incorporated herein by reference in its entirety.

BACKGROUND

1. Technical Field

Embodiments of the present invention generally relate to a semiconductor device and an operating method thereof, more particularly to a semiconductor device capable of monitoring events and an operating method thereof, and more particularly to a semiconductor device capable of monitoring word line access of a semiconductor memory device and operating method thereof.

2. Related Art

A semiconductor memory device monitoring events during a predetermined period may comprise a register storing event information. For example, if a semiconductor device monitors word line access of a semiconductor memory device, the register may store event information comprising an address of a word line and number of accesses to the word line.

FIG. 1 is a block diagram illustrating a data structure of a register used to monitor a word line access for the 2 Gb Dynamic Random Access Memory (DRAM).

The count field stores number of accesses to a corresponding word line and the valid field stores a flag indicating whether information of the corresponding row is valid or not.

The register illustrated in FIG. 1 requires memory space as large as 4.5 Mb. The size of this memory space corresponds to 25% of that of a commercial memory controller, which is too large.

Moreover as the level of integration of semiconductor memory device increases, coupling effect between word lines gets worse. For example, as a word line toggles between active and inactive states, a memory cell in a word line neighboring the toggling word line comes to lose its data. To overcome this word line disturbance effect, a semiconductor device which can efficiently monitor word line access becomes necessary.

SUMMARY

Various embodiments are directed to a semiconductor device capable of monitoring events with a small size of register and an operating method thereof, and more particularly to a semiconductor device capable of monitoring word line access with a small size of register and an operating method thereof.

In an embodiment, a semiconductor device may include a first stage register for storing events occurring for a first period, a second stage register for storing events occurring for a second period shorter than the first period and a controller for controlling the second stage register to select events from the second stage register each having a reference value larger than a second threshold value to the first stage register and for controlling the first stage register to store events which are selected from the second stage register.

In an embodiment, a semiconductor device may include a first stage register for storing information on a first command to a semiconductor memory device occurring for a first period, a second stage register for storing information on the first command occurring for a second period shorter than the first period; and a controller for controlling the second stage register to select information on the first command each having a reference value larger than a second threshold value to the first stage register and for controlling the first stage register to store information the first command which are selected from the second stage register.

In an embodiment, a system may include a semiconductor memory device; and a memory controller for controlling the semiconductor memory device, wherein the memory controller comprises a first stage register for storing information on a first command to the semiconductor memory device occurring for a first period; a second stage register for storing information on the first command occurring for a second period shorter than the first period; and a controller for controlling the second stage register to select information on the first command each having a reference value larger than a second threshold value to the first stage register and for controlling the first stage register to store information on the first command which are selected from the second stage register.

In an embodiment, an operating method of a semiconductor device may include identifying a word line of a semiconductor device whose access number during a second period shorter than a first period is larger than a second threshold value, monitoring access number to the identified word line during the first period and restoring data at one or more memory cells connected to one or more word lines neighboring the word line whose access number during the first period is larger than a first threshold value.

In the operating method, the operating method may further include invalidating information on the identified word line every the first period.

In the operating method, the restoring may include activating the one or more word lines neighboring the word line.

In an embodiment, a semiconductor memory device may include a first stage register for storing information on a first command to a semiconductor memory cell array occurring for a first period, a second stage register for storing information on the first command occurring for a second period shorter than the first period; and a controller for controlling the second stage register to select information on the first command each having a reference value larger than a second threshold value to the first stage register and for controlling the first stage register to store information the first command which are selected from the second stage register.

In the semiconductor memory device, the controller may generate a second command if information on a currently occurred first command exists in the first stage register and the reference value thereof is larger than a first threshold value.

In the semiconductor memory device, the controller may invalidate the first stage register and the second stage register every the first period and the controller invalidates the second stage register every the second period.

The semiconductor memory device may further include a command selector for selecting the first command or the second command controlled by the controller.

The semiconductor memory device, the controller may further include a buffer to store the first command from the command generator while the second command is provided to the memory cell array.

In an embodiment, a memory system includes: a semiconductor memory device; and a memory system controller including a memory controller for controlling the semiconductor memory device, wherein the memory controller includes: a first stage register for storing information on a first command to the semiconductor memory device occurring for a first period; a second stage register for storing information on the first command occurring for a second period shorter than the first period; and a controller for controlling the second stage register to select information on the first command each having a reference value larger than a second threshold value to the first stage register and for controlling the first stage register to store information on the first command which are selected from the second stage register.

In an embodiment, a computing system including a memory system and a central processing unit, the memory system including a memory system controller and a semiconductor memory device, and the memory system controller includes a memory controller, the memory controller includes: a first stage register for storing information on a first command to the semiconductor memory device occurring for a first period; a second stage register for storing information on the first command occurring for a second period shorter than the first period; and a controller for controlling the second stage register to select information on the first command each having a reference value larger than a second threshold value to the first stage register and for controlling the first stage register to store information on the first command which are selected from the second stage register.

DETAILED DESCRIPTION

Figure 1:
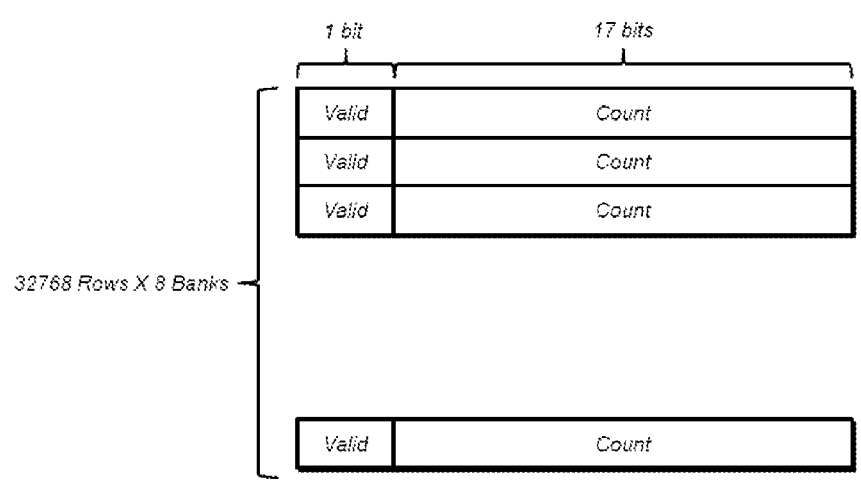
FIG. 1 is a diagram illustrating a data structure of a register according to a prior art.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The semiconductor memory device in the disclosure may comprise a memory cell array including word lines. The kind of the semiconductor memory device is not limited to a specific one in the disclosure. The semiconductor memory device in the disclosure may be embodied as a volatile memory device such as a Dynamic Random Access Memory (DRAM) or a nonvolatile memory device such as Magnetic Random Access Memory (MRAM), Spin Transfer Torque-Random Access Memory (STT-RAM), Flash Memory, Phase Change Random Access Memory (PCRAM) and Resistive Random Access Memory (ReRAM) and etc.

Figure 2:
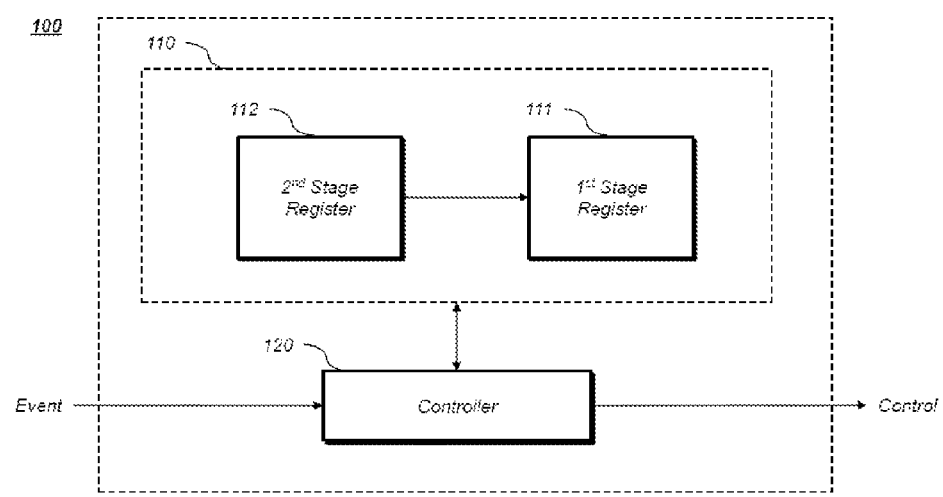
FIG. 2 is a block diagram illustrating a semiconductor device in accordance with an embodiment of the present invention.

FIG. 2 is a block diagram illustrating a semiconductor device in accordance with an embodiment of the present invention.

The semiconductor device 100 may comprise a register 110 for storing event and a controller 120 for controlling the register 110.

The register 110 may comprise a first stage register 111 and a second stage register 112. The first stage register 111 may store event occurring for a first period. The second stage register 112 may store event occurring for a second period which is shorter than the first period. The specific values of the first period and the second period may vary according to embodiments.

The controller 120 may select events whose reference value, such as number of occurrences of the event, are larger than a second threshold value among all events stored in the second stage register 112 and the controller 120 may store the selected events in the first stage register 111. The second threshold value may vary according to the embodiments.

The specific kind or value of the reference value may vary according to the embodiments. For example the time when an event occurs may be used as a reference value for the event in other embodiments.

The controller 120 may control the first stage register 111 to store events occurring for the first period, where the events are limited to those selected from the first stage register 111. For example, though there are 10 events, if the first stage register stores only 3 events which are selected from the second stage register, the first stage register does not store the other 7 events regardless of their occurrences during the first period.

The controller 120 may generate control signal when an event that currently occurred is stored in the first stage register 111 and the reference value thereof is larger than a first threshold value.

An ordinary skill in the art may use information on the event to generate a control signal and select a proper value for the first threshold in accordance of embodiments of the present invention.

The controller 120 may delete or invalidate events stored in the first stage register 111 and the second stage register 112 every first period. And the controller 120 may delete or invalidate events stored in the second stage register 112 every second period.

Though in FIG. 2 there is illustrated an embodiment having a register 110 comprising two sub registers, that is the first stage register 111 and the second stage register 112, other embodiments having a register 110 further comprising a third stage register (not shown) is obvious to an ordinary skill in the art in view of the disclosure and FIG. 2.

In this case, the controller 120 may control the third stage register (not shown) so that events that have occurred more frequently than a third threshold value is selected from the third stage register (not shown) and to be stored in the second stage register 112 every third period shorter than the second period. The third threshold value may suitably be selected by an ordinary skill in the art in accordance with embodiments of the present invention.

The controller 120 may delete or invalidate information stored in the third stage register (not shown) every third period. And the controller 120 may delete or invalidate information stored in the third stage register every first or second period.

In other embodiments, the register 110 may further comprise one or more sub stage registers (not shown) below the third stage register and function of the controller 120 may be expanded to control the one or more sub stage registers (not shown) as described above.

The semiconductor device illustrated in FIG. 2 may be applied to an embodiment to monitor word line access of a semiconductor memory device for a predetermined period. The number of accesses of a word line may be known by checking number of specific commands such as an active command.

As aforementioned, using the register having data structure as illustrated in FIG. 1 to store word line accesses may increase the size of the register too much. The register in accordance with the embodiments of the present invention may decrease the size of the register by monitoring only the selected word lines for longer period, where the selected word lines are selected by comparing number of accesses for a shorter period with a threshold value.

Figure 3:
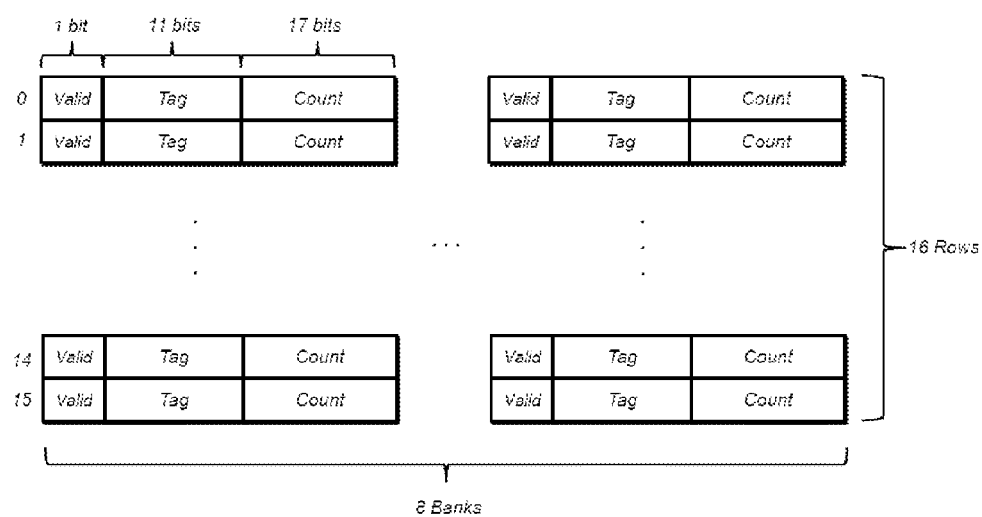
FIG. 3 is a diagram illustrating a data structure of a first stage register in accordance with an embodiment of the present invention.
Figure 4:
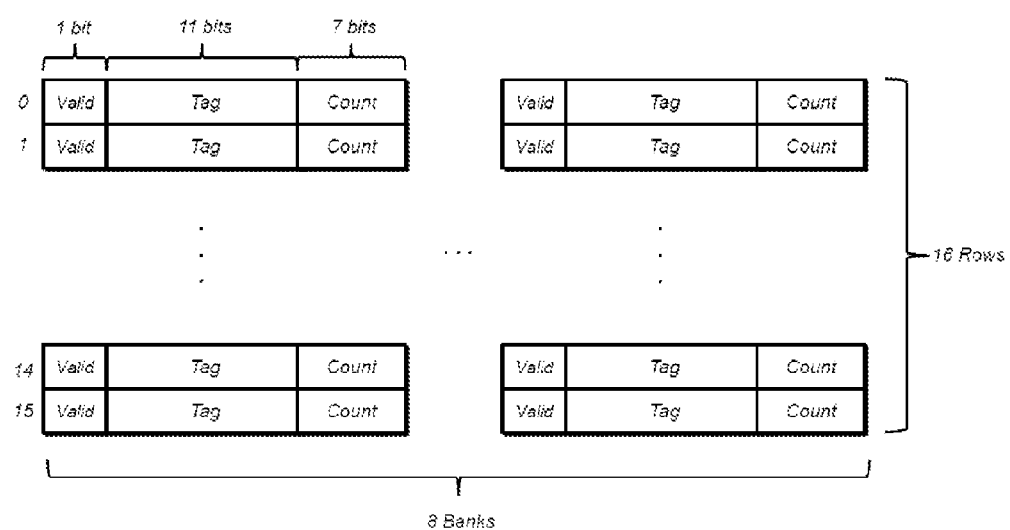
FIG. 4 is a diagram illustrating a data structure of a second stage register in accordance with an embodiment of the present invention.

FIG. 3 illustrates a data structure of a first stage register 111 in accordance with an embodiment of the present invention and FIG. 4 illustrates a data structure of a second stage register 112 in accordance with an embodiment of the present invention.

As illustrated, each of the first stage register 111 and the second stage register 112 may include a valid field, a tag field and a count field. The valid field may represent whether the corresponding row includes valid information or not. The tag field may be used to identify a word line address by combining it with corresponding row number. The count field may represent a number of accesses to the corresponding word line.

The data structures illustrated in FIG. 3 and FIG. 4 are based on a fully associative addressing scheme. If they are based on a direct-mapped addressing scheme, they may not require the tag fields. The ordinary skill in the art may adopt suitable data structure according to an addressing scheme in accordance with embodiments of the present invention.

The first stage register 111 may store number of accesses for a longer time than the second stage register 112 does. Therefore it may be desirable that more bits are allocated at the count field of the first stage register 111.

The memory space required by the first stage register 111 and the second stage register 112 illustrated in FIG. 3 and FIG. 4 is as large as 6 Kb, which is much smaller than 4.5 Mb required by the register according to a prior art as illustrated in FIG. 1.

The semiconductor device in accordance with an embodiment of the present invention may monitor whether the number of accesses to word lines are larger than a threshold value for a first period. The first period may desirably be set to have shorter length than a normal refresh period tREF.

The count field of the second stage register 112 may store 7 bits of count while the count field of the first stage register 111 may store 17 bits of count. Therefore the second period may desirably be set to be about 1/1000 of the first period.

The specific values of the first period and the second period and the number of bits that the count fields can store may vary in accordance with embodiments of the present invention.

Monitoring the word line accesses may be used to solve word lien disturbance problem of the semiconductor memory device.

Figure 5:
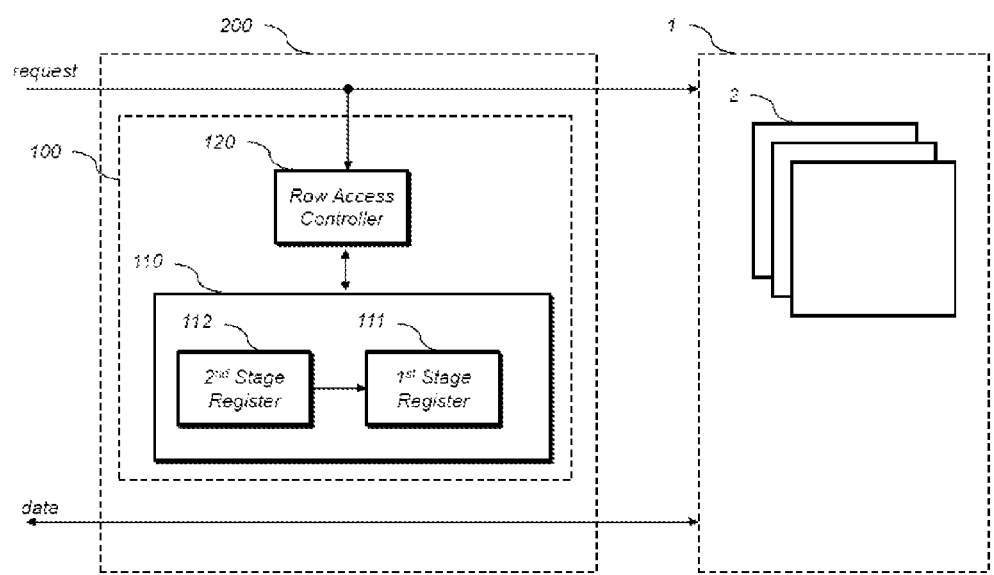
FIG. 5 is a block diagram illustrating a memory controller in accordance with an embodiment of the present invention.

FIG. 5 is a simplified block diagram of the memory controller in accordance with an embodiment of the present invention.

The memory controller may be embodied as a stand-alone device or may be comprised in other semiconductor device like a processor. In the disclosure, the memory controller may be used to designate the memory controller itself or a semiconductor device including the memory controller.

As illustrated in FIG. 5, the memory controller 200 may comprise a register 110 and a controller. The other elements comprised in the memory controller 200 are omitted in FIG. 5, which will be illustrated in detail in FIG. 6.

The register 110 in FIG. 5 may comprise first stage register 111 and the second state register 112 like the register 110 as illustrated in FIG. 2 and the controller 120 may function like the controller 120 in controlling the first stage register 111 and the second stage register 112 as illustrated in FIG. 2.

If a request to the semiconductor memory device 1 is provided from a host, the controller 120 determines whether there is data damage risk at data of a memory cells connected to word lines neighboring the word line corresponding to the request.

If it determines that there is data damage risk, the controller 120 may control the semiconductor memory device 1 to restore data at the memory cells that are connected to word lines neighboring the word line corresponding to the request.

In the embodiment, the controller 120 may check whether the requested word line is stored at the first stage register 111 and the number of accesses to the word line is larger than a threshold value to determine whether there is data damage risk.

The number of accesses to a word line may be represented by the number of activations of the word line. The number of accesses to a word line may be represented by the number of toggles of the word line.

In other embodiments, other reference value instead of the number of accesses may be used to check the data damage risk. In this case the count fields in FIG. 3 and FIG. 4 may be replaced with other kind of data field for the other reference value.

In an embodiment, the neighboring word lines of a word line may represent one or two word lines adjacent to the word line. In an embodiment, the neighboring word lines may represent all word lines that are within a predetermined boundary around the word line.

For example, the neighboring word lines of a word line may represent 8, 16, or other number of word lines around the word line. The specific number of neighboring word lines may vary according to an address scrambling method used for a memory cell array 2.

Method of data restoring is not limited to a specific one. For example, if a semiconductor memory device 1 is a Dynamic Random Access Memory (DRAM), the restoring may be accomplished by activating the neighboring word lines, which is similar to a refresh operation limited to the neighboring word lines.

Figure 6:
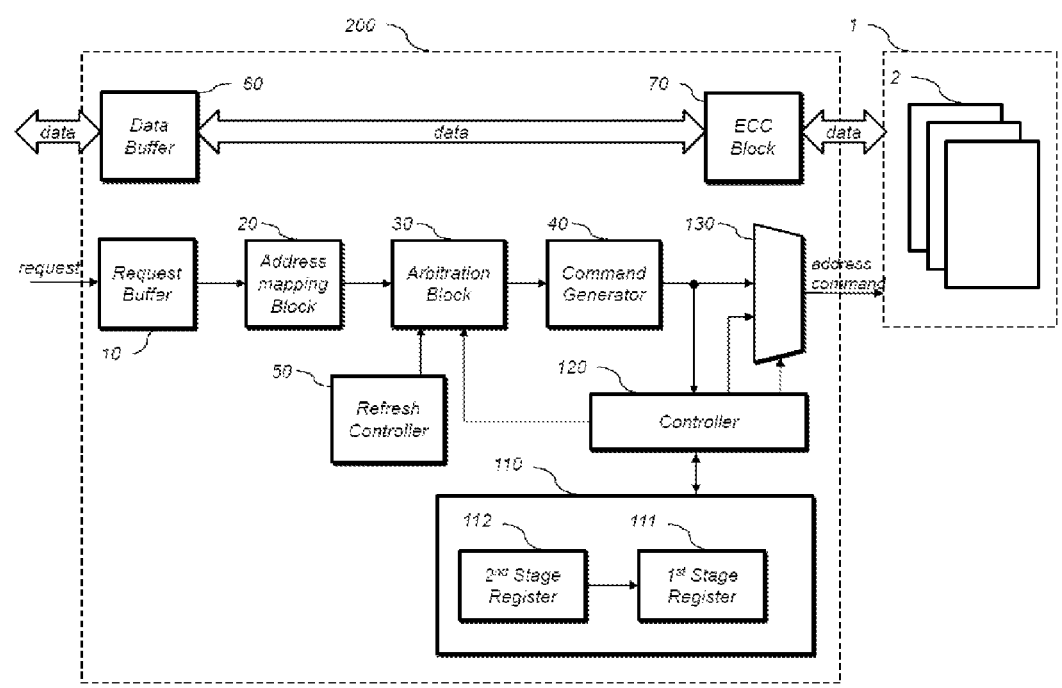
FIG. 6 is a block diagram illustrating a memory controller in accordance with an embodiment of the present invention.

FIG. 6 is a detailed block diagram of a memory controller 200 in an embodiment of the present invention.

The memory controller 200 may comprise the register 110, the controller 120 and a command selector 130.

The memory controller 200 may further comprise a request buffer 10 for temporarily storing an external request, an address mapping block 20 for translating a request address into a physical address of the memory cell array 2, an arbiter 30 for determining order of processing a plurality of requests, a command generator 40 for generating commands corresponding to a selected request at the arbiter 30 to control the semiconductor memory device 1, a refresh controller 50 for controlling refresh operation of the semiconductor memory device 1 and an Error Correcting Code (ECC) block 70 to add parity to a data to store in the semiconductor memory device 1 and to detect error or correct error at the data read from the semiconductor memory device 1, which are normally comprised elements in commercial memory controllers.

The aforementioned description on the register 110 and the controller 120 may also be applied in the embodiment in FIG. 5. The controller 120 may check the first stage register 111 to determine whether a word line having an address corresponding to a command generated from the command generator 40 is accessed more than a first threshold value.

If the number of accesses is larger than the first threshold value the controller 120 may control the command selector 130 to choose a command generated at the controller 120 instead of the command generated at the command generator 40 to provide to the semiconductor memory device 1.

The controller 120 may suspend the processing of commands provided from the command generator 40 while restoring data at the neighboring word lines.

For this, the controller 120 may send a signal to the arbiter 30 to suspend the arbitration operation. When the data restoring at the neighboring word lines is finished, the controller 120 may send another signal to the arbiter 30 to resume the suspended operation.

The memory controller 200 may further comprise a buffer (not shown) to temporarily store a command generated by the command generator 40 while the data is being restored at the neighboring word lines.

The operation of the arbitration block 30 to suspend the operation or resume the suspended operation according to the signal from the controller 120 may be easily implemented by those skilled in the art, and the detailed descriptions thereof are omitted herein.

Figure 7:
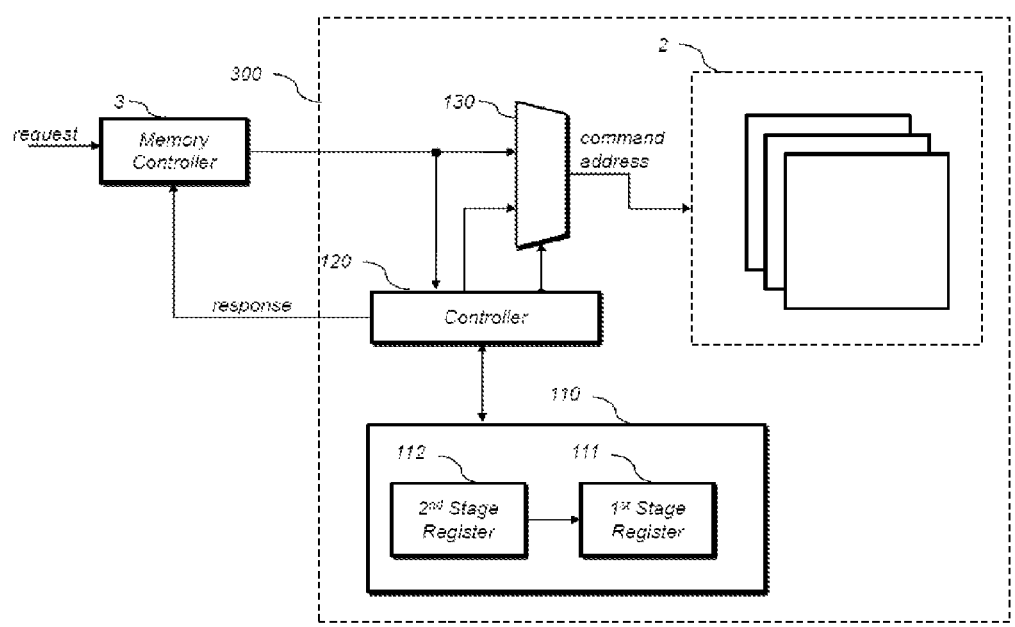
FIG. 7 is a block diagram illustrating a semiconductor memory device in accordance with an embodiment of the present invention.

FIG. 7 is a block diagram illustrating a semiconductor memory device 300 in accordance with an embodiment of the present invention.

Although not illustrated, the semiconductor memory device 300 may include well-known elements required to control general operations thereof, such as an operation of inputting and outputting data to and from the memory cell array 2 or an operation of refreshing the memory cell array 2 and etc.

In FIG. 7, the memory controller 3 may generate a control command/address according to an external request, and may control an operation of inputting and outputting data to and from the memory cell array 2 at the semiconductor memory device 300.

Since the configuration and operation of the memory controller 3 illustrated in FIG. 7 are well known, the detailed descriptions thereof are omitted. The memory controller 3 may be independently implemented, and may be included in another component such as a CPU.

The configurations and operations of the register 110 and the controller 120 in accordance with the embodiments of the present invention are the same as described above.

In the embodiments, the controller 120 receives a command/address transmitted from the memory controller 3, controls the first stage register 111 to check the number of accesses of a word line of the memory cell array 2 corresponding to a requested address, and then compares the number with a threshold value.

When the number of accesses exceeds the threshold value, the controller 120 may generate a command/address for activating neighboring word lines before processing a request for the word line of the requested address, and may control to activate corresponding word lines within the memory cell array 2.

When the activation operation for the neighboring word lines is completed, the controller 120 may process a request for a word line of the requested address.

In the above-described embodiments, the operation of determining whether or not the number of accesses exceeds the threshold value corresponds to an operation of determining whether there is data damage risk at the memory cells connected to a word line corresponding to a requested address or not. In other embodiments, a different method may be used. The activation operation for the neighboring word lines may be one of the methods for restoring the data of memory.

The semiconductor memory device 300 may further comprise a command selector 130 to selectively provide a command from the memory controller 3 or a command from a controller 120 to the memory cell array 2.

When a command generated at the controller 120 is provided to the memory cell array 2, the controller 120 may control the memory controller 3 to suspend the current operation thereof.

The semiconductor memory device 300 may further include a buffer to temporarily store the suspended command sent from the memory controller 3 while activating the neighboring word lines at the memory cell array 2.

Figure 8:
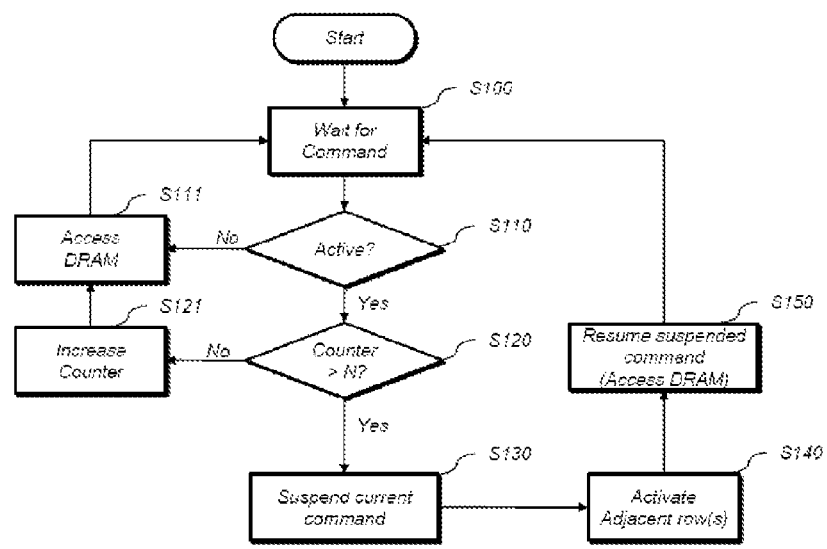
FIG. 8 is a flow chart illustrating an operating method of a semiconductor device in accordance with an embodiment of the present invention.

FIG. 8 is a flow chart illustrating an operation of a semiconductor device in accordance with an embodiment of the present invention.

The operation in the flow chart may be controlled by a controller 120. The controller 120 may control the register 110 and the command selector 130 during the process.

The controller 120 may wait for a command at step S100.

The controller 120 may determine whether the command is an active command at step S110. In the embodiments the controller 120 checks togging of a word line to determine number of accesses to the word line therefore the controller 120 just checks the active command.

If the command is not an active command, the controller 120 may control the command selector 130 to select the command from the command generator 40 to access DRAM at step S111.

If the command is an active command, the controller 120 may determine whether number of accesses to the requested word line is larger than a threshold value N at step S120. The controller 120 may check the first stage register 111 to determine whether the requested address is stored in the first stage register 111 and the counter value corresponding to the requested address is larger than the threshold value N.

If the requested address is stored at the first stage register and the counter value corresponding to the requested address is not larger than the threshold value, the counter value is increased at step S121 and the process proceed to the step S111.

If the requested address is not stored at the first stage register 111, the controller 120 checks the second stage register 112 to find the requested address. If the requested address is not stored at the second stage register 112, the requested address is stored at the second stage register 112 and the counter value is set to 1 at step S121. If the requested address is stored at the second stage register 112, the counter value corresponding to the requested address is increased at the second stage register 112 at step S121. Though it is not illustrated in FIG. 8, every second period the word line whose access number is larger than a second threshold value may be selected from the second stage register and may be stored in the first stage register as aforementioned.

If the requested address is stored at the first stage register and the counter value corresponding to the requested address is larger than the threshold value N, the controller 120 suspend the current command from a command generator 40 at step S130. For this the controller 120 provides a signal to the arbiter 30 to suspend its operation.

And then the controller 120 may activate neighboring rows at step S140. The controller 120 may generate one or more commands to activate neighboring rows and may control the command selector 130 to provide the generated one or more commands to the semiconductor memory device 1.

After finishing the activation of the neighboring rows, the controller 120 may control to resume the suspended command at step S150. For this the controller 120 provides a signal to the arbiter 30 to resume its operation 30.

In other embodiments, a request which corresponds to the suspended command may be kept in the request queue of the arbiter 30 and the request may be processed at the next loop of the flow. In this case the step S150 may be omitted.

Though not included in the flow chart in FIG. 8, the information corresponding to the requested address may be deleted or invalidated from the first stage register 111 after the step S140 since the word line disturbance effect caused by the requested address may be resolved by the operation at step S140. If the semiconductor memory device 1 is a DRAM, the register 110 may be deleted or invalidated after normal refresh operation.

Figure 9:
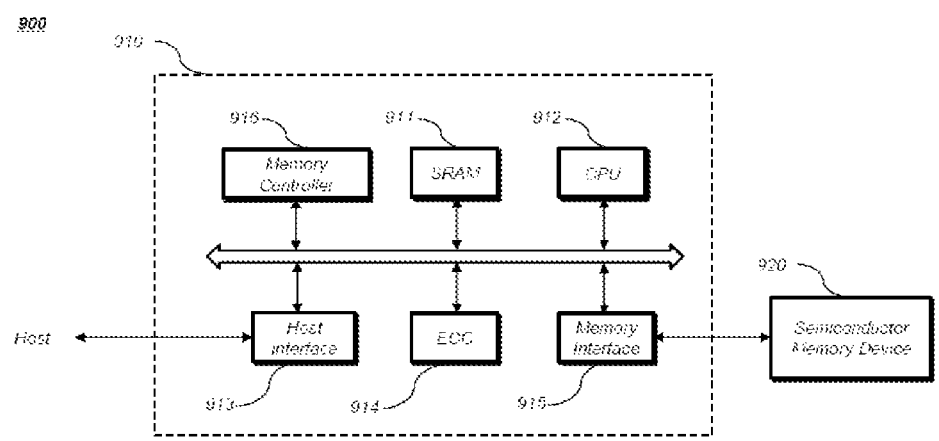
FIG. 9 is a block diagram illustrating a memory system according to an embodiment of the present invention.

FIG. 9 is a block diagram illustrating a memory system according to an embodiment of the present invention.

In FIG. 9, the memory system 900 of the present embodiments may include a semiconductor memory device 920 and a memory system controller 910.

The semiconductor memory device 920 may include the semiconductor memory devices described above with reference to FIGS. 1 through 8. As such, the semiconductor memory device 920, of memory system 900, may be configured as a nonvolatile memory device or as a volatile memory. FIG. 9 depicts a nonvolatile memory device for the semiconductor memory device 920. Additionally, the nonvolatile memory device may be a multi-chip package having flash memory chips.

The memory system controller 910 may include the memory controllers described above with reference to FIGS. 1 through 8. As such, FIG. 9 illustrates memory system controller 910 including a memory controller 916. However, as discussed above the memory controller 916 may be independently implemented, and may be included in another component such as a CPU 912. The memory system controller 910 controls the semiconductor memory device 920, and may include an SRAM 911, a CPU 912, a host interface 913, an ECC 914 and a memory interface 915. The SRAM 911 is used as an operation memory of the CPU 912, the CPU 912 performs control operation for data exchange of the memory system controller 910, and the host interface 913 has data exchange protocol of a host accessed to the memory system 900. The ECC 914 detects and corrects error of data read from the semiconductor memory device 920, and the memory interface 915 interfaces with the semiconductor memory device 920. The memory system controller 910 may include further ROM for storing data for interfacing with the host, etc.

The memory system 900 may be used as a memory card or a solid state disk SSD by combination of the semiconductor memory device 920 and the memory system controller 910. In the event that the memory system 900 is the SSD, the memory system controller 910 communicates with an external device, e.g. host through one of various interface protocols such as USB, MMC, PCI-E, SATA, PATA, SCSI, ESDI, IDE, etc.

Figure 10:
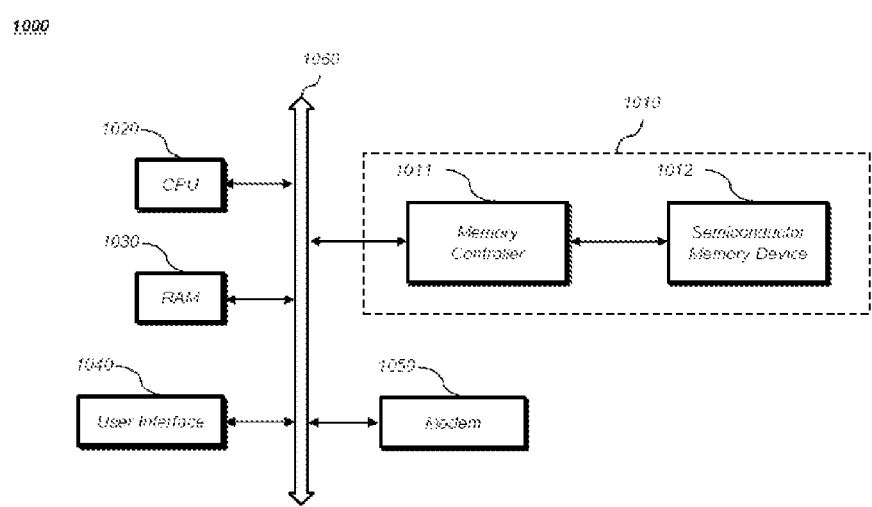
FIG. 10 is a view illustrating a computing system according to an embodiment of the present invention.

FIG. 10 is a view illustrating a computing system according to an embodiment of the present invention.

In FIG. 10, the computing system 1000 of the present embodiments may include a CPU 1020 connected electrically to a system bus 1060, a RAM 1030, an output device 1040, an input device 1050 and a memory system 1010. In case that the computing system 1000 is a mobile device, a battery (not shown) for supplying an operation voltage to the computing system 1000 may be further provided. The computing system 1000 of the present invention may further include an application chipset, a CMOS image processor CIS, a mobile DRAM, etc.

The output device 1040 may be a self-contained display in the case of a portable electronic device. The input device 1050 may be a physical keyboard or a virtual keyboard in the case of a portable electronic device, and may further include, without limitation, a trackball, touchpad, or other cursor control device combined with a selection control, such as a push-button, to select an item highlighted by cursor manipulation. The memory system 1010 may include a semiconductor memory device 1012 and a memory system controller 1011, and memory controller 916 (see FIG. 9) as described in FIG. 9.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
a first stage register for storing events occurring for a first period;
a second stage register for storing events occurring for a second period shorter than the first period; and
a controller for controlling the second stage register to select events from the second stage register each having a reference value larger than a second threshold value to the first stage register and for controlling the first stage register to store events which are selected from the second stage register.

2. The semiconductor device of claim 1, wherein the controller generates a control signal if a currently occurred event is stored in the first stage register and the reference value thereof is larger than a first threshold value.

3. The semiconductor device of claim 2, wherein the reference value corresponding to an event comprise number of occurrences of the event.

4. The semiconductor device of claim 1, wherein the controller invalidates the first stage register and the second stage register every the first period, and the controller invalidates the second stage register every the second period.

5. The semiconductor device of claim 1, further comprising: a third stage register for storing events occurring for a third period shorter than the second period, and wherein the controller for controlling the third stage register to select events each having a reference value larger than a third threshold and for controlling the second stage register to store events which are selected from the third stage register.

6. A semiconductor device comprising:
a first stage register for storing information on a first command to a semiconductor memory device occurring for a first period;

a second stage register for storing information on the first command occurring for a second period shorter than the first period; and a controller for controlling the second stage register to select information on the first command each having a reference value larger than a second threshold value to the first stage register and for controlling the first stage register to store information the first command which are selected from the second stage register.

7. The semiconductor device of claim 6, wherein the second period is about 1/1000 of the first period.

8. The semiconductor device of claim 6, wherein the controller generates a second command if information on a currently occurred first command exists in the first stage register and the reference value thereof is larger than a first threshold value.

9. The semiconductor device of claim 8, further comprising:

an arbiter for determining processing order of requests to the semiconductor memory device;

a command generator for generating the first command to provide to the semiconductor memory device corresponding to a request from the arbiter; and a command selector for selecting the first command or the second command controlled by the controller.

10. The semiconductor device of claim 9, wherein the controller controls the arbiter to suspend operation thereof when the second command is generated.

11. The semiconductor device of claim 9, further comprising a buffer to store the first command from the command generator while the second command is provided to the semiconductor memory device.

12. The semiconductor device of claim 8, wherein the first command is a command for activating a word line of the semiconductor memory device and information on the first command comprises an address of the word line and the reference value comprises number of activations of the word line, and the second command is a command to restore data in one or more memory cells corresponding to word lines neighboring the word line whose number of activations is larger than the first threshold value.

13. The semiconductor device of claim 6, wherein the controller invalidates the first stage register and the second stage register every first period and the controller invalidates the second stage register every second period.

14. The semiconductor device of claim 13, further comprising: a third stage register for storing events occurring for a third period shorter than the second period, and wherein the controller for controlling the third stage register to select events each having a reference value larger than a third threshold and for controlling the second stage register to store events which are selected from the third stage register.

15. The semiconductor device of claim 14, wherein the controller invalidates the third stage register every third period.

16. A system, comprising:

a semiconductor memory device; and a memory controller for controlling the semiconductor memory device, wherein the memory controller comprises:

a first stage register for storing information on a first command to the semiconductor memory device occurring for a first period;

a second stage register for storing information on the first command occurring for a second period shorter than the first period; and a controller for controlling the second stage register to select information on the first command each having a reference value larger than a second threshold value to the first stage register and for controlling the first stage register to store information on the first command which are selected from the second stage register.

17. The semiconductor device of claim 16, wherein the controller generates a second command if information on a currently occurred first command exists in the first stage register and the reference value thereof is larger than a first threshold value.

18. The semiconductor device of claim 16, wherein the controller invalidates the first stage register and the second stage register every the first period and the controller invalidates the second stage register every the second period.

\* \* \* \* \*